United States Patent
Takeuchi et al.

(10) Patent No.: US 9,202,717 B2
(45) Date of Patent: Dec. 1, 2015

(54) METHOD OF MAKING LIQUID DISCHARGE HEAD, LIQUID DISCHARGE HEAD, LIQUID DISCHARGE APPARATUS HAVING LIQUID DISCHARGE HEAD, AND MANUFACTURING APPARATUS OF LIQUID DISCHARGE HEAD

(71) Applicants: Atsushi Takeuchi, Kanagawa (JP); Osamu Machida, Kanagawa (JP); Akira Shimofuku, Kanagawa (JP); Xianfeng Chen, Kanagawa (JP); Ryo Tashiro, Kanagawa (JP)

(72) Inventors: Atsushi Takeuchi, Kanagawa (JP); Osamu Machida, Kanagawa (JP); Akira Shimofuku, Kanagawa (JP); Xianfeng Chen, Kanagawa (JP); Ryo Tashiro, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 316 days.

(21) Appl. No.: 13/727,758

(22) Filed: Dec. 27, 2012

(65) Prior Publication Data
US 2013/0169713 A1 Jul. 4, 2013

(30) Foreign Application Priority Data

Dec. 29, 2011 (JP) ................................. 2011-290291
Dec. 19, 2012 (JP) ................................. 2012-276506

(51) Int. Cl.
| | | |
|---|---|---|
| H01L 21/00 | (2006.01) | |
| B05C 11/00 | (2006.01) | |
| B05C 13/00 | (2006.01) | |
| B05C 13/02 | (2006.01) | |
| B05B 7/00 | (2006.01) | |
| H01L 21/62 | (2006.01) | |
| B41J 2/01 | (2006.01) | |
| B41J 2/16 | (2006.01) | |

(52) U.S. Cl.
CPC . *H01L 21/62* (2013.01); *B41J 2/01* (2013.01); *B41J 2/161* (2013.01); *B41J 2/1626* (2013.01); *B41J 2/1631* (2013.01); *B41J 2/1646* (2013.01)

(58) Field of Classification Search
CPC ....................................................... B41J 2/1621
See application file for complete search history.

(56) References Cited

U.S. PATENT DOCUMENTS 7,137,179 B2 * 11/2006 Yokouchi et al. ............ 29/25.35

FOREIGN PATENT DOCUMENTS

| JP | 3636349 | 4/2005 |
|---|---|---|
| JP | 3888459 | 3/2007 |
| JP | 2011-108906 | 6/2011 |

* cited by examiner

*Primary Examiner* — Manish S Shah
*Assistant Examiner* — Renee I Wilson
(74) *Attorney, Agent, or Firm* — Cooper & Dunham LLP

(57) ABSTRACT

A method of making a liquid discharge head which includes a nozzle to discharge liquid, a pressure chamber communicating with the nozzle, a pressure chamber substrate to form surfaces of the pressure chamber, and a piezoelectric actuator to apply pressure to liquid in the pressure chamber having a lower electrode, a ferroelectric film, and an upper electrode, includes a silicon wafer supplying process, a position adjustment process, a surface treatment process to reform a surface of the lower electrode, a liquid applying process to apply ferroelectric precursor on the lower electrode by an inkjet method, a heating process to heat the ferroelectric precursor film, and a cooling process. A series of processes from the position adjustment process to the cooling process is iterated to form a ferroelectric film having a predetermined thickness. The series of processes is performed with certain waiting times inserted between key processes.

8 Claims, 13 Drawing Sheets

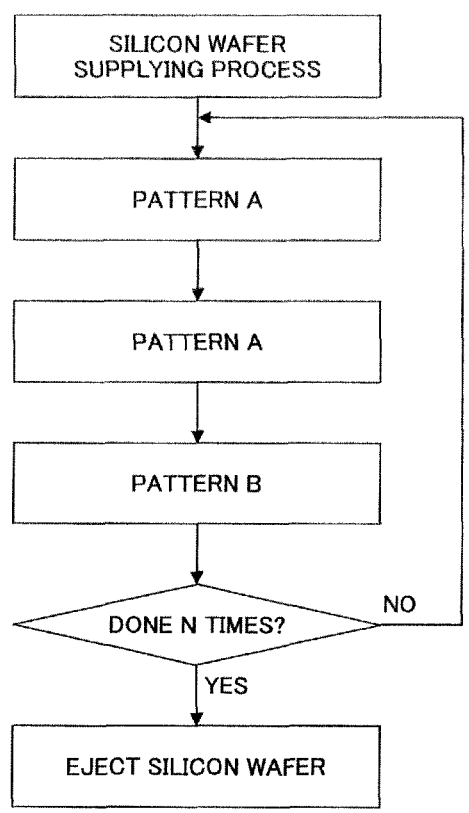

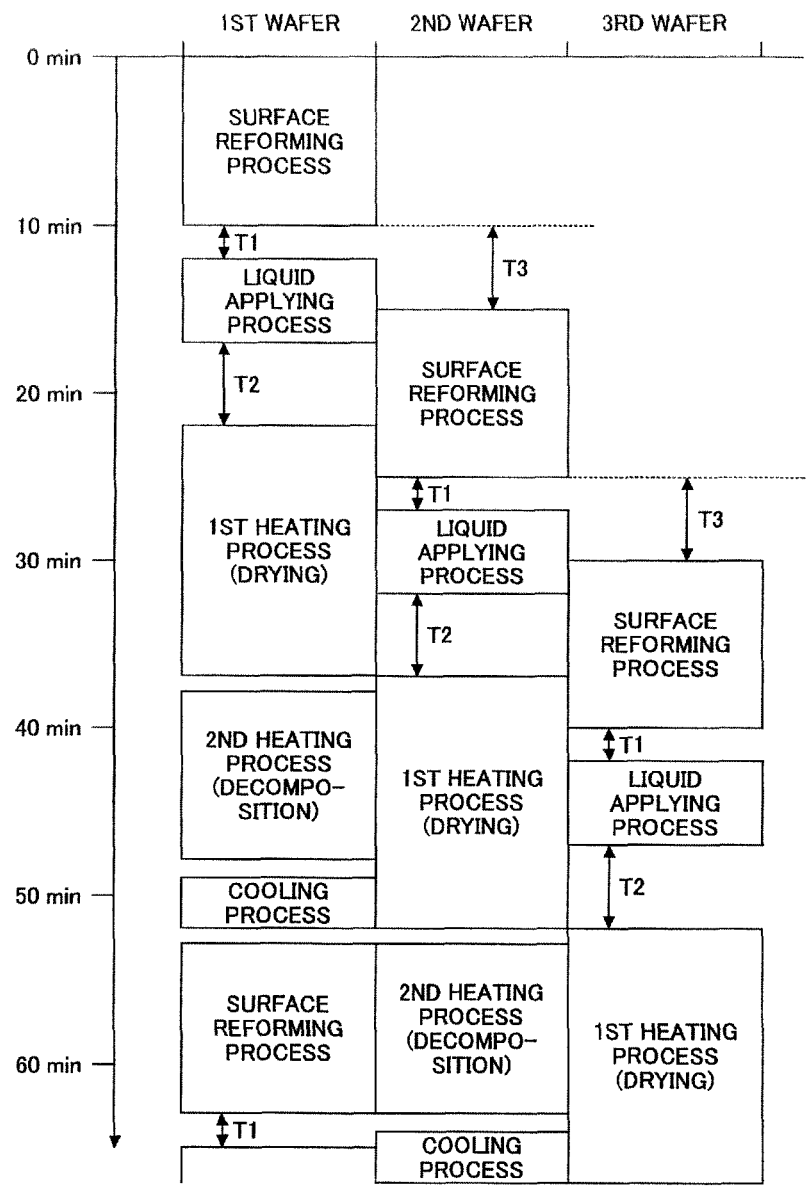

BEFORE LIQUID APPLYING PROCESS

AFTER SURFACE REFORMING PROCESS

AFTER HEATING PROCESS

AFTER 2ND OR LATER SURFACE
REFORMING PROCESS

AFTER 2ND OR LATER HEATING PROCESS

WAFER INSERTED

HEATING PROCESS

COOLING PROCESS

WAFER EJECTED

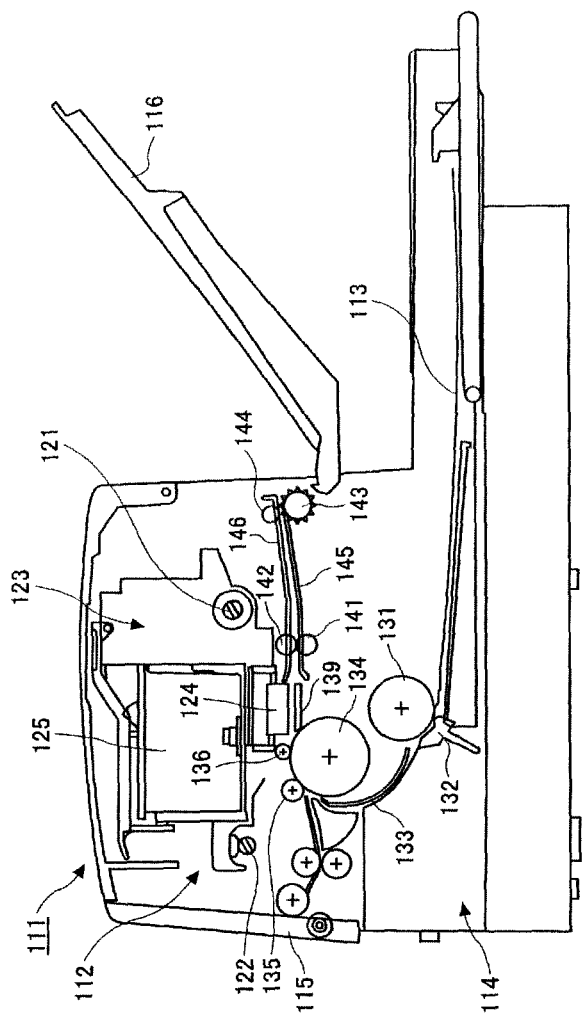

METHOD OF MAKING LIQUID DISCHARGE HEAD, LIQUID DISCHARGE HEAD, LIQUID DISCHARGE APPARATUS HAVING LIQUID DISCHARGE HEAD, AND MANUFACTURING APPARATUS OF LIQUID DISCHARGE HEAD

BACKGROUND OF THE INVENTION

1. Field of the Invention

The disclosures herein generally relate to a method of making a liquid discharge head, a liquid discharge head, a liquid discharge apparatus having a liquid discharge head, and a manufacturing apparatus of a liquid discharge head. A liquid discharge head may be used for an inkjet recording head in an image recording apparatus or an image forming apparatus such as a printer, a facsimile machine, a copy machine, etc.

2. Description of the Related Art

For years, a piezoelectric actuator has been put to practical use as a part of an inkjet recording head. An inkjet recording head discharges ink from an opening of a nozzle communicating with a pressure chamber by applying pressure to the pressure chamber which is formed partly with a vibrating plate which is deformed by a piezoelectric actuator. One type of piezoelectric actuators practically used is extendable and retractable along the axis direction of the actuator. Another type of piezoelectric actuators practically used utilizes deflection force.

A publicly known method of making a piezoelectric actuator utilizing deflection force is as follows. First, a piezoelectric body layer is formed on a surface of a vibrating plate. Then, the piezoelectric body layer is cut into pieces according to the shapes of pressure chambers by using lithography so that each of the pressure chambers has an independent piezoelectric actuator.

As a piezoelectric body layer, a ferroelectric film such as lead zirconate titanate is used. As a method of forming a ferroelectric film, for example, the "Chemical Solution Deposition method", also called the "Sol-gel method", is known. With this method, a ferroelectric film is formed by applying ferroelectric precursor sol, then, executing a heating and crystallization process to crystallize, and repeating these processes for a predetermined count. Japanese Patent No. 3636349, for example, discloses details.

Application of sol may be done with an inkjet applying unit. The applied sol is then crystallized by a heating process to form ferroelectric thin film. With this method, patterning is possible. Japanese Laid-open Patent Publication No. 2011-108996, for example, discloses details. According to this method, the amount of wasted sol may be reduced.

The conventional film-forming method of a ferroelectric film disclosed in Japanese Patent No. 3636349 has a problem in that desired characteristics of a ferroelectric film may not be obtained due to the following reasons. When applying the ferroelectric precursor sol with the inkjet applying unit, variations of nozzles or defective nozzles in an inkjet head may induce misalignment of impact positions of droplets. A small amount of the misalignment may result in less precise patterning, which affects the form of a ferroelectric film and the characteristics.

Incidentally, variations in waiting times between the application of ferroelectric precursor sol and the heating and crystallization process to form ferroelectric film is a cause of variations in forms of the baked paint film.

During a waiting time between the application of sol and the heating and crystallization process, solvent in the application liquid is evaporating. The evaporation changes physical properties of the application liquid. Therefore, the length of a waiting time affects movement of solute during the crystallization, Movement of solute during the crystallization also affects the form of the paint film after the crystallization. When using fast drying application liquid, the form of the paint film is notably affected by the length of a waiting time.

Japanese Laid-open Patent Publication No. 2011-108996 shows an example in which a surface treatment process is executed before applying ferroelectric precursor sol by the inkjet applying unit. Effects of the surface treatment weaken as time passes. Therefore, variations in waiting times between the surface treatment and the application of sol may cause variations in patterning precision.

SUMMARY OF THE INVENTION

It is a general object of at least one embodiment of the present invention to provide a method of making a liquid discharge head, a liquid discharge head, a liquid discharge apparatus having a liquid discharge head, and a manufacturing apparatus of a liquid discharge head that substantially obviate one or more problems caused by the limitations and disadvantages of the related art.

Specifically, in one embodiment, a method of making a liquid discharge head which has stable piezoelectric characteristics and discharge characteristics with reduced variations in forms of ferroelectric film and/or in patterning precision is provided.

According to an embodiment, a method of making a liquid discharge head includes
  a nozzle to discharge liquid,
  a pressure chamber communicating with the nozzle,
  a pressure chamber substrate to form surfaces of the pressure chamber, and
  a piezoelectric actuator to apply pressure to liquid in the pressure chamber, the piezoelectric actuator being formed on one of the surfaces of the pressure chamber substrate via a vibrating plate, having a lower electrode, a ferroelectric film, and an upper electrode,
the method including
  a silicon wafer supplying process to preprocess the silicon wafer and to store the silicon wafer in a housing member;
  a position adjustment process to convey the silicon wafer to a stage to orient the silicon wafer to be properly processed in subsequent processes;
  a surface treatment process to reform at least a part of a surface of the lower electrode,
  a liquid applying process to apply liquid including ferroelectric precursor on the lower electrode with the reformed surface by an inkjet method to form a ferroelectric precursor film,
  a heating process to heat the ferroelectric precursor film, and
  a cooling process to cool the silicon wafer heated by the heating process,
  wherein a series of processes from the position adjustment process to the cooling process is iterated for a predetermined count with an above order to form a ferroelectric film having a predetermined thickness, the series of processes being performed on multiple silicon wafers in a pipelined way, the series of processes being performed with a predetermined waiting time provided between a completion of the surface treatment process and a start of the surface treatment process for a next silicon wafer, resulting in at least one of following times T1 or T2 being kept to a fixed length where T1 is a time between a completion of the surface treatment process and a start of the liquid applying process, and T2 is a time between a completion of the liquid applying process and a start of the heating process.

The invention provides a method of making a liquid discharge head which has stable piezoelectric characteristics and discharge characteristics with reduced variations in forms of ferroelectric film and/or in patterning precisions.

BRIEF DESCRIPTION OF THE DRAWINGS

Other objects and further features of embodiments will be apparent from the following detailed description when read in conjunction with the accompanying drawings, in which:

FIGS. 1A-C are flowcharts illustrating examples of manufacturing processes of a ferroelectric film used for a piezoelectric actuator in a method of making a liquid discharge head of an embodiment of the invention;

FIG. 3 is an example of a timing chart of manufacturing processes of ferroelectric films according to one embodiment;

FIG. 10 is an explanatory side view of a mechanical section of an inkjet recording apparatus as an example of a liquid discharge apparatus of an embodiment of the invention.

DESCRIPTION OF THE PREFERRED EMBODIMENTS

In the following, embodiments of the present invention will be described with reference to the accompanying drawings. Specifically, a method of making a liquid discharge head, a liquid discharge head, a liquid discharge apparatus having the liquid discharge head, and a manufacturing apparatus of the liquid discharge head will be described. It is noted that the present invention is not limited to the following embodiments, but various variations and modifications may be made within the province of those skilled in the art, without departing from the scope of the present invention.

Figure 8:
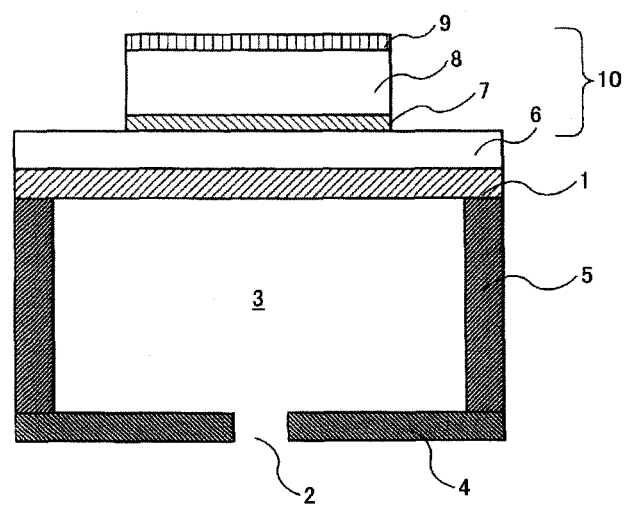
FIG. 8 is a cross-sectional schematic view illustrating an example of a liquid discharge head of an embodiment of the invention.

A method of making a liquid discharge head, for example, as shown in FIG. 8, includes
a nozzle 2 to discharge liquid,
a pressure chamber 3 communicating with the nozzle 2,
a pressure chamber substrate 5 to form surfaces of the pressure chamber 3, and
a piezoelectric actuator 10 to apply pressure to liquid in the pressure chamber 3, the piezoelectric actuator 10 being formed on one of the surfaces of the pressure chamber substrate 5 via a vibrating plate 1, having a lower electrode 6-7, a ferroelectric film 8, and an upper electrode 9, including a silicon wafer supplying process to form the lower electrode on a surface of a silicon wafer to be formed into the pressure chamber substrate, then, to store the silicon wafer in a housing member, a position adjustment process to convey the silicon wafer to a stage to align a center of the silicon wafer on the stage and a position of an orientation flat, a surface treatment process to reform at least a part of a surface of the lower electrode, a liquid applying process to apply liquid including ferroelectric precursor on the lower electrode with the reformed surface by an inkjet method to form a ferroelectric precursor film, a heating process to heat the ferroelectric precursor film, and a cooling process to cool the silicon wafer heated by the heating process, wherein a series of processes from the position adjustment process to the cooling process is iterated for a predetermined count in an above order to form a ferroelectric film having a predetermined thickness, the series of processes being performed with a predetermined waiting time provided between a completion of the surface treatment process and a start of the surface treatment process for a next silicon wafer, and at least one of following times T1 or T2 is kept at a fixed length where T1 is a time between a completion of the surface treatment process and a start of the liquid applying process, and T2 is a time between a completion of the liquid applying process and a start of the heating process.

First Embodiment

Figure 1A:
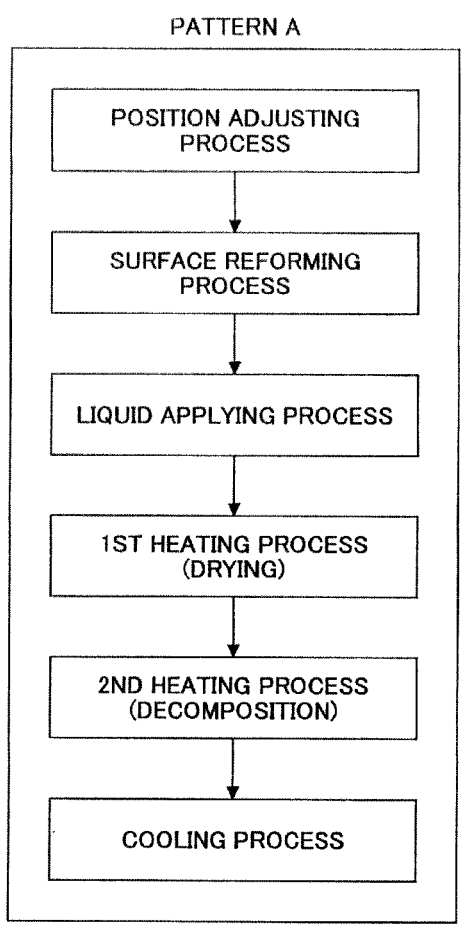
Figure 1B:
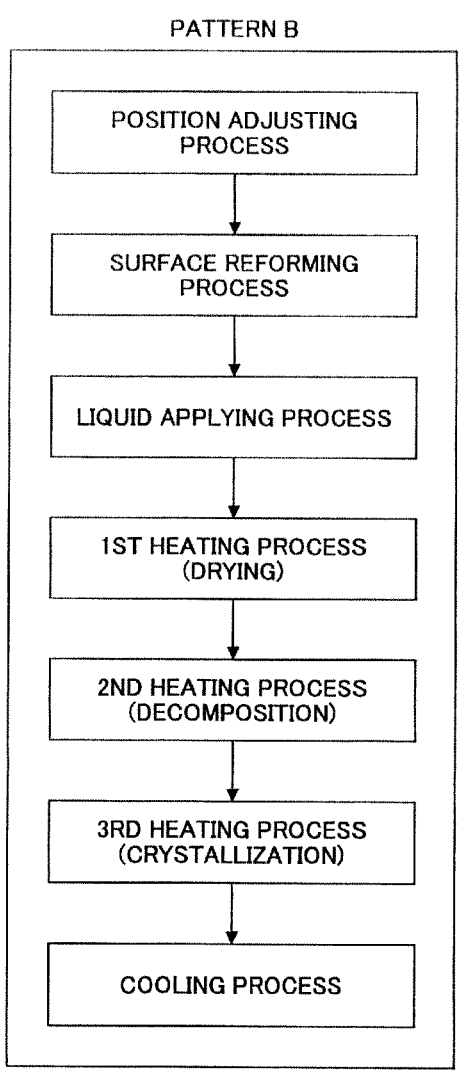

FIGS. 1A-C are flowcharts illustrating examples of manufacturing processes of a piezoelectric actuator using deflection force in a method of making a liquid discharge head of the invention. A series of processes from the position adjustment process to the cooling process is iterated for a predetermined count to form a ferroelectric film with predetermined thickness.

FIG. 1A shows a pattern "A" where drying and decomposition are included in the heating process. FIG. 1B shows another pattern "B" where drying, decomposition and crystallization are included in the heating process. FIG. 1C shows a manufacturing flow in which the pattern "A" and pattern "B" are iterated for n times to form a ferroelectric film with a predetermined thickness.

Figure 2:
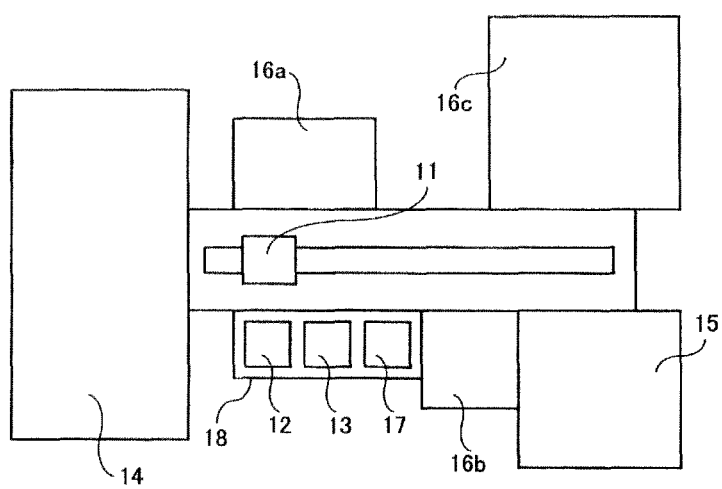
FIG. 2 is a plan view illustrating schematically an example of a film forming apparatus which is a part of a manufacturing apparatus of an embodiment of the invention.

FIG. 2 is a plan view of a film forming apparatus which operates fully automatically according to the flowchart shown in FIG. 1. Operations of the apparatus shown in the FIG. 2 will be described later.

FIG. 3 is a timing chart of the processes for manufacturing piezoelectric actuators with ferroelectric films according to the flowchart shown in FIG. 1. In FIG. 3, the first 60 minutes of operations for processing three silicon wafers concurrently are shown.

As shown in FIG. 3, after the surface treatment process of the first silicon wafer has been completed, the surface treatment process of the second silicon wafer is not started immediately. It is controlled to start after a waiting time designated by T3, for example, five minutes, has passed.

The reason why to provide a predetermined waiting time T3 is to prevent the film forming apparatus from being idle when processing multiple silicon wafers in a pipelined way. If multiple silicon wafers are put into the film forming apparatus in order with an interval time shorter than the processing time of the longest process (in FIG. 3, the longest process is the first heating process), the longest process, which is the bottleneck among all processes, makes a queue of silicon wafers before the process. To avoid this, T3 may be set as follows:

> T3+processing time for the first process=processing time for the longest process Namely, before putting the second wafer or subsequent wafers, by waiting for the processing time for the first process plus T3, it can be avoided that an additional waiting time arises before the longest process. In FIG. 3, the first process is the surface treatment process and the longest process is the first heating process. Therefore, by setting T3 to satisfy the following equation, > T3+processing time for the surface treatment process=processing time for the first heating process, it is possible to avoid a waiting queue before the first heating process.

On the other hand, to improve quality of formed films, it is desirable that at least one of following times T1 or T2 is kept to a fixed length where T1 is a time between a completion of the surface treatment process and a start of the liquid applying process, and T2 is a time between a completion of the liquid applying process and a start of the heating process. This is because by keeping T1 to a fixed length, it is possible to avoid variations of effects of surface treatment and precision of patterning, and by keeping T2 to a fixed length, it is possible to avoid variations of forms of films after crystallization.

To keep only T1 to a fixed length, it is sufficient to treat three consecutive processes of the surface treatment process, a waiting time T1, and the liquid applying process as a single process, and to set T1 so that the single process becomes the longest process as described above. In this way, it is possible to set T1 without taking care of additional waiting times before or after T1. Namely, a condition to keep T1 to a fixed length is as follows:

> T3+processing time for the surface treatment process=processing time for the surface treatment process+T1+processing time for the liquid applying process, which is simplified to:

> T3=T1+processing time for the liquid applying process

To keep only T2 to a fixed length, it is sufficient to treat three consecutive processes of the liquid applying process, a waiting time T2, and the first heating process as a single process, and to set T2 so that the single process becomes the longest process as described above. In this way, it is possible to set T2 without taking care of additional waiting times before or after T2. Namely, a condition to keep T2 to a fixed length is as follows:

> T3+processing time for the liquid applying process=processing time for the surface treatment process+T2+processing time for the first heating process To keep both T1 and T2 to fixed lengths, one may considered as above. Alternatively, to get an optimal T3 as shown in FIG. 3, a time between a completion of the first process and a start of the first heating process for the first wafer may be set to have the same length as a time between the start time and the completion of a waiting time T2 for the second wafer. Namely, > T1+processing time for the liquid applying process+T2+processing time for the first heating process=T3+processing time for the surface treatment process+T1+processing time for the liquid applying process+T2

Since the completion time of the first heating process for the first wafer and the completion time of T2 for the second wafer are synchronized, no additional waiting time after T2 arises when processing the second wafer to proceed to the next process, which is the first heating process. The equation just above is simplified to:

> processing time for the first heating process=T3+processing time for the surface treatment process It is noted that it is preferable that both T1 and T2 be kept unchanged while the series of processes is iterated for a predetermined count.

FIG. 2 is a plan view of a film forming apparatus which operates fully automatically according to the flowchart shown in FIG. 1.

The apparatus shown in FIG. 2 is a wafer processing apparatus provided with a conveying means 11. The conveying means 11 is located at the center of other processing means. Therefore, moving times between the processes can be kept stable.

In the silicon wafer supplying process, the conveying means 11 conveys a silicon wafer from a housing member 12 provided on a stage 18 to a position adjusting means 13.

The housing member 12 can accommodate one lot of silicon wafers.

Figure 4A:
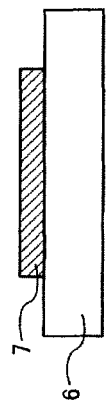
FIGS. 4A-B are partial cross-sectional views of a piezoelectric actuator used for a liquid discharge head.

The housing member 12 accommodates one lot of silicon wafers on which platinum 6 is coated on the entire surface as a lower electrode as shown in FIG. 4A, and a conductive oxide 7, for example, $SrNuO_3$, is formed on the platinum 6 by processes of sputtering, photolithography, and etching.

By accommodating one Lot of silicon wafers, management of silicon wafers and production status becomes easier. The silicon wafers may be managed by, for example, assigning a management number to each one of the silicon wafers flowing in the automated film forming apparatus, tracing its production history by sequence control, and displaying the status on a monitor.

The position adjusting means 13 adjusts the center of a silicon wafer and a position of the orientation flat.

Next, the silicon wafer is conveyed to a surface treatment means 14. After the first silicon wafer has been conveyed, the second silicon wafer is conveyed from the housing member 12 to the position adjusting means 13. By iterating these operations successively, a quiescent time can be minimized.

The surface treatment means 14 forms a self-assembled monolayer film, called a "SAM film" hereafter, on an upper part of a lower electrode. During the surface treatment process, the SAM film is formed only on the surface of the lower electrode, or the platinum 6, to become hydrophobic. The SAM film is not formed on the conductive oxide electrode 7.

After the surface treatment process, the silicon wafer is conveyed to a liquid applying means 15 by the conveying means 11 to be treated with the liquid applying process after a predetermined waiting time T1.

The liquid applying means applies a sol-gel solution including a ferroelectric precursor to the silicon wafer by an inkjet method.

Liquid droplets of the sol-gel solution are not discharged on the SAM film by the inkjet method. The liquid droplets are discharged only onto the oxide electrode 7. This contrast of wettability forms a paint film of ferroelectric precursor, called "PZT film" hereafter, only onto the oxide electrode 7, and reduces disturbance of a liquid applying pattern caused by misalignment of impact positions of the liquid droplets to form patterning of the PZT film with high precision.

With the liquid applying process, forming of the ferroelectric precursor on the silicon wafer is completed. After a predetermined waiting time T2, the silicon wafer is conveyed to a first heating means 16a by the conveying means 11 where the first heating process is executed. The first heating means 16a is a means for drying using a contact heating method. In the present embodiment, a hot-plate is provided. By heating with the contact heating method using the hot-plate, volatile components generated when dehydrating the sol-gel solution can be exhausted easily.

The silicon wafer dehydrated with the first heating process is conveyed to a second heating means 16b by the conveying means 11 where the second heating process is executed. The second heating means 16b is a means for decomposition of the dehydrated paint film, the heating method may be a non-contact heating method or a contact heating method, depending on decomposition conditions. In the present embodiment, a hot-plate is provided. It can be heated, for example, by directly contacting the silicon wafer with the surface of the hot-plate, or by keeping a minute gap between the surface of the hot-plate and the silicon wafer to execute non-contact heating. Indirect heating may reduce dependency on types of substrates and the taken time.

The silicon wafer with the second heating process completed is conveyed to a cooling means 17 or a third heating means 16c according to the sequence of the flowchart shown in FIG. 1.

The silicon wafer conveyed to the cooling means 17 has the cooling process applied, with which the silicon wafer is naturally-cooled to the temperature in the apparatus.

The silicon wafer conveyed to the third heating means 16c has applied the third heating process applied. The silicon wafer with the third heating process completed is conveyed to the cooling means 17 by the conveying means 11.

The cooling means 17 has a multi-layer structure. It can cool multiple silicon wafers simultaneously to minimize quiescent times of the film forming apparatus.

The silicon wafer completed with the cooling process is conveyed again to the position adjusting means 13. The series of processes is iterated for the predetermined count to form a ferroelectric film with the predetermined thickness.

A method for forming the SAM film partially on the lower electrode with the surface treatment process is shown in FIG. 5A-E.

A SAM film is formed based on a phenomenon that alkanethiols array themselves on platinum group metals. The formed SAM film becomes hydrophobic because alkyl is located on the surface side.

Figure 5A:
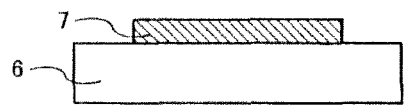
FIGS. 5A-E are schematic views illustrating an example of a surface treatment process.
Figure 5B:
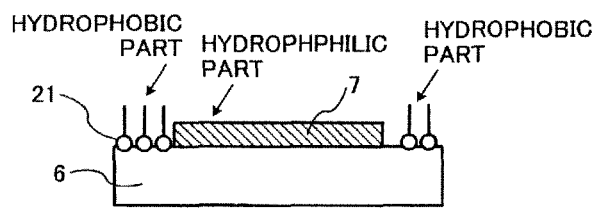
Figure 5C:
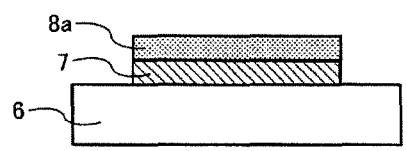

In the present embodiment, the silicon wafer having the lower electrode of the oxide electrode 7 partially formed on the platinum electrode 6 as shown in FIG. 5A is dipped into alkanethiol solution, for example, $CH_3(CH_2)$—SH. As alkanethiols form a SAM film only on platinum group metals in general, the SAM film 21 is formed on the platinum 6 as shown in FIG. 5B. As shown in FIG. 5C, since the SAM film 21 is removed with the heating process executed after the application of the sol-gel solution, the surface treatment process and the SAM forming process should be done in the second and later iterations.

Figure 5D:
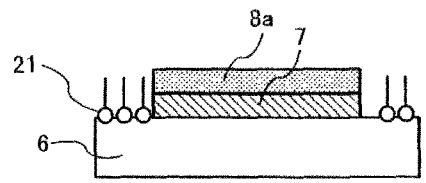
Figure 5E:
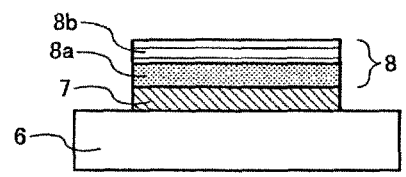

In the second and later heating processes, the SAM processing is applied to the substrate having the PZT film only on the oxide electrode 7. As shown in FIG. 5D, the SAM film is not formed on the PZT film 8a, which is an oxide, and the SAM film is only formed on the platinum 6. The contrast of wettability is formed as in the first surface treatment process. The series of processes iterated twice form two layers of PZT film 8a, 8b as shown in FIG. 5E.

The silicon wafer conveyed to the third heating means 16c has the third heating process applied. The third heating means 16c is a means for crystallization of a paint film, and heat is applied with a non-contact heating method. In the present embodiment, an infrared lamp is provided. By heating with the infrared lamp, crystallization temperature can be controlled stably to obtain a ferroelectric film with stable characteristics.

FIGS. 6A-6D show an example of the third heating process using a heating and crystallization furnace as the third heating means 16c.

As shown in FIGS. 6A-6D, a heating and crystallization furnace 300 is partitioned into an upper frame 30 and a lower frame 31 provided with an infrared lamp 32a or 32b and a cooling passage 33a or 33b, respectively.

Figure 6A:
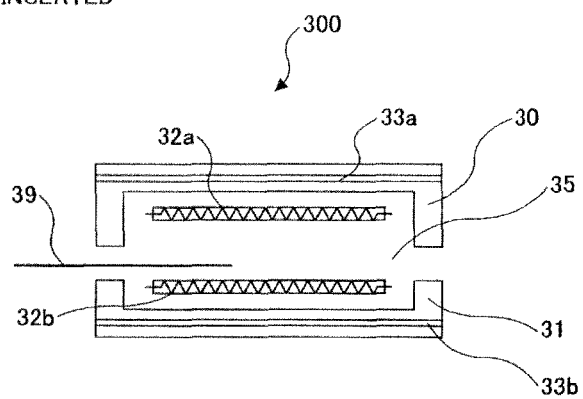
FIGS. 6A-D are schematic views illustrating an example of a third heating process.
Figure 6B:
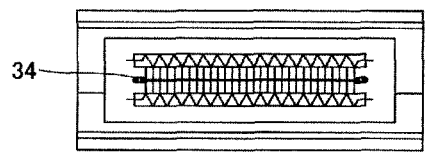

As shown in FIG. 6A, the silicon wafer 39 with the first layer of ferroelectric precursor film applied is conveyed into a space 35 by the conveying means 11 after the upper frame 30 has been lifted up, and held by a holder 34 provided in the lower frame 31. After the silicon wafer 39 has been held, the upper frame 30 is lowered to close the heating and crystallization furnace 300 as shown in FIG. 6B. The furnace is heated by the infrared lamps 32a and 32b to a predetermined temperature. Depending on heating conditions, only one of the infrared lamps 32a or 32b may be used.

Figure 6C:
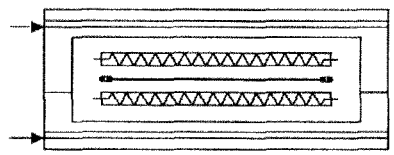
Figure 6D:
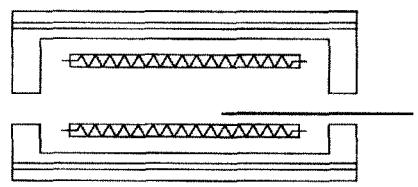

After completing the heating process according to prescribed conditions, the cooling process begins. As shown in FIG. 6C, coolant is circulated in the cooling passages 33a and 33b to cool the upper frame 30 and the lower frame 31, which lowers the temperature of the space 35 and the temperature of the silicon wafer 39.

After the temperature in the space 35 is lowered to a predetermined ejection temperature, the upper frame 30 is lifted up. Then, the conveying means 11 holds the silicon wafer 39, releases the holder 34 provided in the lower frame 31, and ejects the silicon wafer 39 from the heating and crystallization furnace 300.

As described above, the heating and crystallization furnace 300 as the third heating means processes wafers one by one. Therefore, it is always controlled under predetermined crystallization conditions with few variations for processing conditions of ferroelectric precursor films and silicon wafers, which enables stable crystallization. This makes it possible to produce piezoelectric actuators with stable displacement.

Figure 4B:
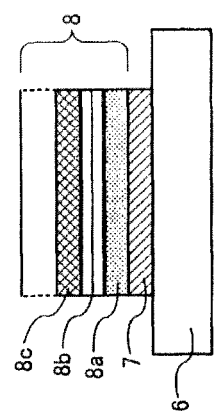

As described above, by iterating the series of the processes, as shown in FIG. 4B schematically, the lower electrode and the ferroelectric film are formed on the silicon wafer. By using the method and apparatus of the invention, it is possible to stably produce piezoelectric actuators with few variations, by iterating the series of the processes in the above order for a predetermined count to form the ferroelectric film on the lower electrode.

Second Embodiment

Figure 7:
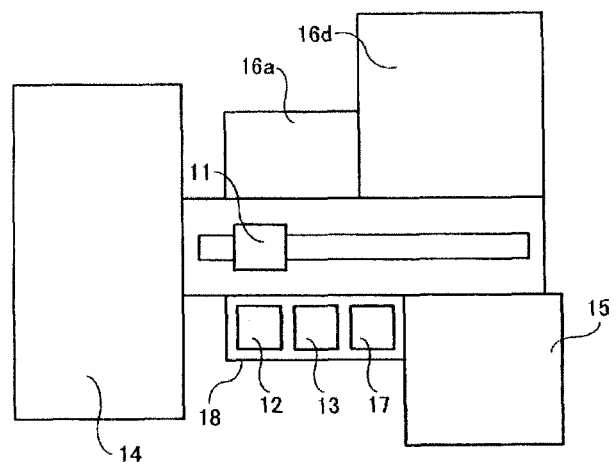
FIG. 7 is a plan view illustrating schematically another example of a film forming apparatus which is a part of a manufacturing apparatus of an embodiment of the invention.

The heating and crystallization furnace shown in FIGS. 6A-6D as the third heating means may be used as the second heating means for executing the second heating process. FIG. 7 is a plan view of such an automated film forming apparatus.

As shown in FIG. 7, by sharing a single heating means for multiple heating processes, the configuration of the apparatus can be simplified. Also, the second heating process and the third heating process can be executed successively without conveyance.

Third Embodiment

In the first embodiment, the surface treatment process is preceded by the position adjustment process. The position adjustment process may be executed between the surface treatment process and the liquid applying process. It is more preferable that time difference between the completion of the surface treatment process and the start of the liquid applying process be stable throughout the successive film forming processes.

It is noted that the timing of the position adjustment process is not limited to the above timing. It can be executed at timings other than before the surface treatment process or before the liquid applying process.

Image Forming Apparatus

Next, a liquid discharge apparatus, or an inkjet recording apparatus as an image forming apparatus provided with the liquid discharge head, or an inkjet recording head of an embodiment of the invention will be explained with FIG. 9 and FIG. 10.

Figure 9:
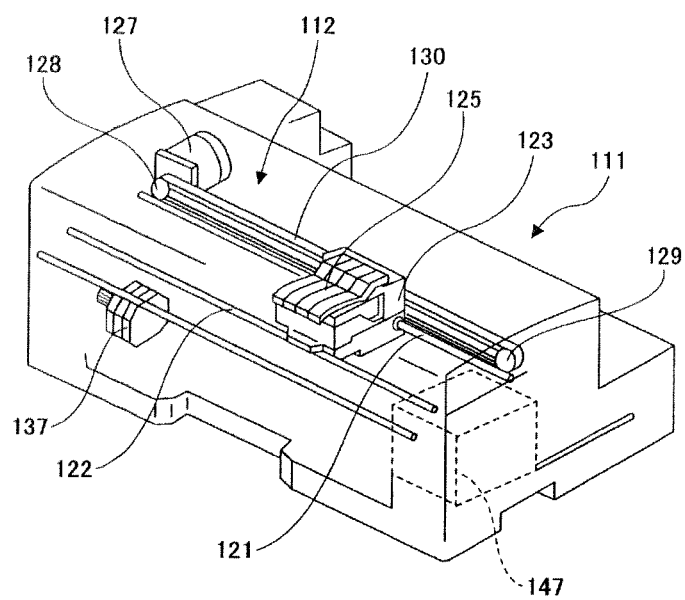
FIG. 9 is an explanatory perspective view of an inkjet recording apparatus as an example of a liquid discharge apparatus of an embodiment of the invention.

FIG. 9 is an explanatory perspective view of an inkjet recording apparatus 111. FIG. 10 is an explanatory side view of a mechanical section for printing of the inkjet recording apparatus 111.

The inkjet recording apparatus 111 of an embodiment of the invention provides a mechanical section for printing 112 in a main unit 111 of the apparatus 111 including the following parts: a carriage 123 moveable in a main scanning direction;
the inkjet recording heads 124 attached to the carriage 123;
ink cartridges 125 supplying ink to the inkjet recording heads 124;
a paper feed cassette 114, or a paper feed tray 114 to hold plural sheets of paper 113, which can be easily attached to or detached from a lower part of the main unit 111 from the front side of the main unit 111;
and a manual feeding tray 115 for feeding the sheets of paper 113 manually, which can be opened outward to be pulled down.

The sheets of paper 113 are fed into the main unit 111 from the paper feed cassette 114 or the manual feeding tray 115. Images are printed on the sheets of paper 113 by the printing mechanical section 112. The sheets of paper 113 are then ejected to a paper output tray 116 attached to the back side of the main unit 111.

The mechanical section for printing 112 holds the carriage 123 with a main guide rod 121 and a secondary guide rod 122 which are guiding members supported by left and right side plates not shown in the figure. The carriage 123 is held in a way that it can slide freely along the main scanning direction which is perpendicular to the moving direction of paper. The carriage 123 has the inkjet recording heads 124 to discharge ink droplets with corresponding colors of yellow, cyan, magenta, and black. The inkjet recording heads 124 are aligned so that multiple ink discharging nozzles 2 (see FIG. 8) cross the main scanning direction, the nozzles discharging ink droplets directed downward.

The carriage 123 has the ink cartridges 125 attached, which are exchangeable, to provide ink of the colors to the inkjet recording heads 124.

The ink cartridge 125 has an air inlet on the upper part to communicate with the atmosphere, an ink supplying outlet on the lower part to supply ink to the inkjet recording head 124, and a porous body inside filled with ink. Capillary force of the porous body gives a pressure biased a bit to negative to the ink to be supplied to the inkjet recording head 124.

It is noted that a single inkjet recording head 124 with multiple color nozzles 2 may be used instead of multiple inkjet recording heads 124 for the colors used here.

The backside of the carriage 123 is fit around the main guide rod 121 in such a way that the carriage 123 slides freely. The back side is the downstream side of sheet conveyance. The front side of the carriage 123 is placed on the secondary guide rod 122 in such a way that the carriage 123 slides freely. The front side is the upstream side of sheet conveyance. To move the carriage 123 for scanning along the main scanning direction, a timing belt 130 is wrapped around and stretched between a driving pulley 128 driven by a main scanning motor 127 and a driven pulley 129. The carriage 123 is fixed to the timing belt 130 and is reciprocated with forward and reverse rotations of the main scanning motor 127.

On the other hand, to convey the sheets of paper 113 in the paper feed cassette 114 to a place for printing under the head 124, the following parts are provided: a sheet feeding roller 131 and a friction pad 132 to separate and feed one of the sheets 113 from the paper feed cassette 114, a guiding member 133 to guide the sheet 113, conveying roller 134 to convey and flip the sheet 113, a pressing roller 135 pressed to the conveying roller 134, and a tip end roller 136 to set an ejecting angle of the sheet 113 from the conveying roller 134. The conveying roller 134 is driven rotationally by the secondary scanning motor 137 via a series of gears.

A printed sheet supporting member 139 is provided as a guiding member to guide the sheet 113 under the recording head 124 coming out from the conveying roller 134. The width of the printed sheet supporting member 139 may correspond to a moving range of the carriage 123 along the main scanning direction. In the direction to which sheets are conveyed from the printed sheet supporting member 139, the following parts are provided: a pressing roller 141 which is driven rotationally to feed the sheet 113 in the direction of ejection, a spur 142, an ejection roller 143 and a spur 144 to feed the sheet 113 to the paper output tray, and guiding members 145, 146 to form an ejection route for the sheet 113.

When recording an image on the sheet 113, while the carriage 123 is moved, the inkjet recording head 124 is driven in response to image signals, and discharges ink onto the sheet 113 for recording a line of image data. Then, the sheet 113 is conveyed by a predetermined amount to record the next line. By receiving a signal indicating the completion of the recording or a signal indicating that the rear end of the sheet 113 has been reached, a series of recording operations is completed, and the sheet 113 is ejected.

A recovering device 147 is provided at a rightmost end of the moving range, outside of the recording range, of the carriage 123 to recover the inkjet recording head 124 from discharge failures. The recovering device 147 includes a capping means, a suctioning means, and a cleaning means. To protect the carriage 123 from discharge failures possibly caused by ink dehydration, the carriage 123 is moved to the recovering device 147 while waiting for printing. The inkjet recording head 124 is capped with the capping means to keep the discharge outlet moist.

Also, by discharging the ink whose colors are not relevant to a particular recording, all the outlets have the same ink viscosity to keep stable discharge performance. If a discharge failure occurs, the outlet, or the nozzle of the inkjet recording head 124 is sealed up by the capping means, then, bubbles are suctioned from the nozzle with ink through a tube by the suctioning means. Ink or dust sticking to the outlet is removed by the cleaning means, and the inkjet recording head 124 is recovered from the discharge failure. The suctioned ink is dumped into a waste ink reservoir (not shown here) provided at a lower part of the main unit, and kept in an ink absorber in the waste ink reservoir.

As described above, in the present embodiment, the inkjet recording apparatus equipped with inkjet recording heads of embodiments of the invention provides stable piezoelectric characteristics and discharge characteristics to improve image quality.

Also, the liquid discharge head and the liquid discharge apparatus equipped with the liquid discharge head of embodiments of the invention can be used for other applications such as 3D molding technology using the inkjet technology because of the stable liquid discharge characteristics.

Further, the present invention is not limited to these embodiments, but various variations and modifications may be made without departing from the scope of the present invention.

The present application is based on Japanese Priority Application No. 2011-290291 filed on Dec. 29, 2011, and No. 2012-276506 filed on Dec. 19, 2012, with the Japanese Patent Office, the entire contents of which are hereby incorporated by reference.

What is claimed is:

1. A method of making a piezoelectric actuator including a lower electrode, a ferroelectric film, and an upper electrode, the method comprising:
   a silicon wafer supplying process to preprocess a silicon wafer and to store the silicon wafer in a housing member;
   a position adjustment process to convey the silicon wafer to a stage to orient the silicon wafer to be properly processed in subsequent processes;
   a surface treatment process to reform at least a part of a surface of the lower electrode;
   a liquid applying process to apply liquid including ferroelectric precursor on the lower electrode with the reformed surface by an inkjet method to form a ferroelectric precursor film;
   a heating process to heat the ferroelectric precursor film; and
   a cooling process to cool the silicon wafer heated by the heating process,
   wherein a series of processes from the position adjustment process to the cooling process is iterated for a predetermined count with an above order to form a ferroelectric film having a predetermined thickness, the series of processes being performed on multiple silicon wafers in a pipelined way, the series of processes being performed with a predetermined waiting time provided between a completion of the surface treatment process and a start of the surface treatment process for a next silicon wafer, resulting in at least one of following times T1 or T2 kept to a fixed length where T1 is a time between a completion of the surface treatment process and a start of the liquid applying process, and T2 is a time between a completion of the liquid applying process and a start of the heating process.

2. The method as claimed in claim 1, wherein the housing member accommodates one lot of silicon wafers.

3. The method as claimed in claim 1, wherein the heating process includes multiple heating processes with different heating methods.

4. The method as claimed in claim 3, wherein the heating process includes a first heating process, a second heating process, and a third heating process, the first heating process being a contact heating method, the second heating process being a contact heating method or a non-contact heating method, and the third heating process is a non-contact heating method.

5. A piezoelectric actuator made by the method claimed in claim 1.

6. A liquid discharge head, comprising:
   a nozzle to discharge liquid;
   a pressure chamber communicating with the nozzle;
   a pressure chamber substrate to form surfaces of the pressure chamber; and
   the piezoelectric actuator claimed in claim 5, to apply pressure to liquid in the pressure chamber, the piezoelectric actuator being formed on one of the surfaces of the pressure chamber substrate via a vibrating plate.

7. A liquid discharge apparatus provided with a liquid discharge head as claimed in claim 6.

8. A manufacturing apparatus for producing a piezoelectric actuator by the method claimed in claim 1, comprising:
   a film forming apparatus including at least a conveying means, a housing means, a position adjusting means, a surface treatment means, a liquid applying means, a heating means, and a cooling means.

* * * * *